US008638157B2

(12) United States Patent
Duby et al.

(10) Patent No.: US 8,638,157 B2
(45) Date of Patent: Jan. 28, 2014

(54) LEVEL SHIFTING CIRCUITRY

(75) Inventors: Jean-Claude Duby, Saint Egreve (FR); Mikael Rien, Saint Ismier (FR); Damien Guyonnet, Crolles (FR)

(73) Assignee: ARM Limited, Cambridge (GB)

( * ) Notice: Subject to any disclaimer, the term of this patent is extended or adjusted under 35 U.S.C. 154(b) by 317 days.

(21) Appl. No.: 13/067,305

(22) Filed: May 23, 2011

(65) Prior Publication Data

US 2012/0299631 A1    Nov. 29, 2012

(51) Int. Cl.
*H03L 5/00*    (2006.01)

(52) U.S. Cl.
USPC ............................................ 327/333

(58) Field of Classification Search
None
See application file for complete search history.

(56) References Cited

U.S. PATENT DOCUMENTS

| | | | |
|---|---|---|---|
| 6,043,698 A | | 3/2000 | Hill |
| 6,278,294 B1 * | | 8/2001 | Taniguchi ..................... 326/80 |
| 6,452,429 B1 * | | 9/2002 | Lim ............................ 327/108 |
| 6,593,795 B2 * | | 7/2003 | Cho ............................ 327/333 |
| 7,233,178 B2 * | | 6/2007 | Yu et al. ...................... 327/112 |

OTHER PUBLICATIONS

Khan, Q.A. et al., "A Single Supply Level Shifter for Multi-Voltage Systems", VLSI Design, (2006), 4 pages.
Chavan, A. et al., "Ultra Low Voltage Level Shifters to Interface Sub and Super Threshold Reconfigurable Logic Cells", IEEEAC Paper #1345, Version 12, (Dec. 17, 2007), pp. 1-6.
Tran, C.Q. et al., "Low-power High-speed Level Shifter Design for Block-level Dynamic Voltage Scaling Environment", 2005 IEEE International Conference on Integrated Circuit and Technology, pp. 229-232.
Koo, K-H et al., "A New Level-Up Shifter for High Speed and Wide Range Interface in Ultra Deep Sub-Micron", IEEE, pp. 1063-1065.
Garcia, J.C. et al., "High Performance Bootstrapped CMOS Dual Supply Level Shifter for 0.5V Input and 1V Output", 12th Euromicro Conference on Digital System Design/Architectures, Methods and Tools, (2009), pp. 311-314.
Kumar, M. et al., "Level Shifter Design for Low Power Applications", International Journal of Computer Science & Information Technology, vol. 2, No. 5, (Oct. 2010), pp. 124-132.

* cited by examiner

*Primary Examiner* — Lincoln Donovan
*Assistant Examiner* — Khareem E Almo
(74) *Attorney, Agent, or Firm* — Nixon & Vanderhye P.C.

(57) ABSTRACT

Level shifting circuitry comprises a first level shifter and a second level shifter. In response to a falling edge transition of an input signal, the first level shifter generates a primary transition of a first intermediate signal faster than the second level shifter generates a secondary transition of a second intermediate signal. In response to a rising edge of the input signal, the second level shifter generates a primary transition of the second intermediate signal faster than the first level shifter generates a secondary transition of the first intermediate signal. Output switching circuitry is provided to switch an output signal between an output high voltage level and an output low voltage level in response to the primary transition of the first intermediate signal and the primary transition of the second intermediate signal.

13 Claims, 12 Drawing Sheets

LEVEL SHIFTING CIRCUITRY

BACKGROUND OF THE INVENTION

1. Field of the Invention

The present invention relates to the field of integrated circuits. More particularly, the invention relates to level shifting circuitry.

2. Description of the Prior Art

Level shifters are used in integrated circuits to convert a signal from a portion of a circuit operating with one voltage domain into a signal for another portion of a circuit operating with a different voltage domain. FIGS. 1A and 1B of the accompanying drawings illustrate an example of a level shifter for converting an input signal from a low voltage domain to an output signal for a high voltage domain. The input signal switches between a low voltage level 0 and a high voltage level VddL and the output signal switches between a low voltage level 0 and a high voltage level VddH. Although in this example the low voltage level remains the same for both the input signal and the output signal, it will be appreciated that the low voltage level could also be converted by the level shifter.

FIG. 1A shows the operation of the level shifter in response to a rising edge of the input signal. As the input signal rises to the input high voltage level VddL, the NMOS transistor N5 switches on. This pulls the gate of PMOS transistor P4 low, switching on transistor P4. The gate of NMOS transistor N2 is then pulled high, turning on transistor N2. NMOS transistor N2 pulls node A to the low voltage level. Hence, PMOS transistor P3 is switched on and pulls the output signal to the output high voltage level VddH.

Conversely, FIG. 1B illustrates the operation of the level shifter in response to a falling edge of the input signal. As the input signal drops to the input low voltage level, PMOS transistor P5 is turned on, pulling the gate of NMOS transistor N1 high. NMOS transistor N1 turns on, pulling the gate of PMOS transistor P2 low and switching transistor P2 on. Hence, the gate of transistor N3 is pulled high. This turns on NMOS transistor N3 and pulls the output signal to the output low voltage level.

As shown in FIG. 1A, in response to the rising edge the node A is pulled directly to the low voltage supply level by transistor N2, thus causing transistor P3 to pull the output signal high. In contrast, in response to the falling edge of the input signal as shown in FIG. 1B, when transistor N1 is turned on, it doesn't directly pull node A to the high voltage supply level VddH. Transistor N1 first needs to turn on transistor P2 to pull node A to the high voltage supply level VddH. However, the gate of transistor P1 is also coupled to node A, and so transistor P1 remains on for a period in competition with the transistor N1 until node A is pulled sufficiently high to switch off transistor P1.

Hence, the delay between a rising edge of the input signal and node A being pulled down to the low voltage level is shorter than the delay between a falling edge of the input signal and node A being pulled up to the high voltage level. Hence, the level shifter responds more slowly to the falling edge transition of the input signal than the rising edge transition. The slow falling edge response limits the maximum frequency at which the level shifter can operate.

Other kinds of level shifter have been provided to increase the maximum operating frequency, but at the expense of increased DC current leakage, which increases the power consumption of the level shifter. The present technique seeks to provide a level shifting circuit that is capable of operating at higher frequencies, without increasing DC current leakage.

SUMMARY OF THE INVENTION

Viewed from one aspect the present invention provides level shifting circuitry for generating an output signal in response to an input signal, said input signal having one of an input high voltage level and an input low voltage level, said output signal having one of an output high voltage level and an output low voltage level, said level shifting circuitry comprising:

a first level shifter configured to generate a first intermediate signal having a primary transition in response to a falling edge transition of said input signal and a secondary transition in response to a rising edge transition of said input signal, said falling edge transition comprising a transition from said input high voltage level to said input low voltage level and said rising edge transition comprising a transition from said input low voltage level to said input high voltage level; and a second level shifter configured to generate a second intermediate signal having a primary transition in response to said rising edge transition of said input signal and a secondary transition in response to said falling edge transition of said input signal; wherein:

said first level shifter is configured to generate said primary transition of said first intermediate signal in response to said falling edge transition faster than said second level shifter generates said secondary transition of said second intermediate signal in response to said falling edge transition;

said second level shifter is configured to generate said primary transition of said second intermediate signal in response to said rising edge transition faster than said first level shifter generates said secondary transition of said first intermediate signal in response to said rising edge transition; and said level shifting circuitry comprises output switching circuitry configured to switch said output signal between said output high voltage level and said output low voltage level in response to said primary transition of said first intermediate signal and said primary transition of said second intermediate signal.

The present technique provides level shifting circuitry comprising two level shifters, one for triggering an output in response to the rising edge transition and the other for triggering an output in response to the falling edge transition. Each level shifter responds to the input signal by generating an intermediate signal having a primary transition and a secondary transition. In the first level shifter, the primary transition is generated in response to a falling edge transition and the secondary transition is generated in response to a rising edge transition, and in the second level shifter, the primary transition is generated in response to the rising edge transition and the secondary transition generated in response to the falling edge transition. The first level shifter is faster than the second level shifter when responding to a falling edge transition, and the second level shifter is faster than the first level shifter when responding to a rising edge transition.

The output signal is switched between the output high voltage level and the output low voltage level in response to the primary transitions of the first and second intermediate signals. The secondary transitions of the first and second intermediate signals do not have a significant impact on the output signal. Each level shifter can be designed to generate the primary transition relatively quickly without needing to consider the response speed of the secondary transition. The level shifting circuitry can therefore respond relatively quickly to both edges of the input signal, allowing the level shifting circuitry to operate at higher frequencies.

In one embodiment, a rising edge transition of the input signal may trigger a rising edge transition of the intermediate signals, and a falling edge transition may trigger a falling edge of the intermediate signals. Alternatively, a rising edge of the input signal may trigger a falling edge of the intermediate signal, and vice versa. Similarly, the relationship between the intermediate signals and the output signal may be rising edge to rising edge and falling edge to falling edge, or rising edge to falling edge and falling edge to rising edge. Although particular examples are described herein, it will be appreciated that additional inverters can be inserted into signal paths to change the relationship between transitions of an input signal and transitions of a subsequent signal.

Although it would be possible to use the level shifting circuitry for converting between a high voltage domain and a low voltage domain, typically the level shifting circuitry would be used for converting an input signal from a low voltage domain to an output signal for a high voltage domain. In this case, a difference between the output high voltage level and the output low voltage level may be greater than a difference between the input high voltage level and the input low voltage level.

The first and second level shifters may comprise any level shifters in which the first level shifter responds faster to the falling edge transition than the second level shifter and the second level shifter responds faster to the rising edge transition than the first level shifter.

In one embodiment, the first level shifter may comprise a first feedback loop which retains signal values in one of a first state and a second state in dependence on the input signal, and the second level shifter may comprise a second feedback loop which retains signal values in one of the first and second states in dependence on the input signal. In the feedback loops, the first or second intermediate signal may be obtained from an intermediate output point of the feedback loop. Hence, the respective feedback loops are placed in the first state or second state in dependence on the current value of the input signal, and the first and second intermediate signals take on values corresponding to the current state of the feedback loops. This arrangement provides a compact circuit layout.

The first and second feedback loops may each comprise a falling edge input point at which an initialising signal value may be input in response to the falling edge transition of the input signal, and a rising edge input at which an initialising signal value may be input in response to the rising edge transition of the input signal. Whether the initialisation is input at the falling edge input point or the rising edge input point controls whether the feedback loops are placed in the first stage or the second stage, which in turn controls the value of the corresponding intermediate signals. Hence, as the input signal transitions between the input high voltage level and the input low voltage level, the initialising signal will successively be input at the falling edge input point and the rising edge input point, the feedback loops will transition between the first and second states, the intermediate signals will undergo primary transitions and secondary transitions as the signal values in the feedback loops change, and the output signal will accordingly switch between the output high voltage level and the output low voltage level.

Various mechanisms can be used for inputting the initialising value to the falling edge and rising edge input points of the feedback loops. In one embodiment, the first and second feedback loops each comprise a first gating device for selectively coupling the falling edge input point to a voltage supply in response to a falling edge transition of the input signal, and a second gating device for selectively coupling the rising edge input point to the voltage supply in response to the rising edge transition of the input signal. For example, the first and second gating devices may comprise a transistor whose gate is controlled either by the input signal or an inverse of the input signal.

There are a number of ways of varying the configuration of the first and second level shifters to provide different response delays in response to the falling and rising edges of the input signals. For example, differently sized transistors can be provided in the first and second level shifters, and/or the signal propagation delay along various signals paths of the level shifters can be adjusted, in order to provide the desired response speed for the rising or falling edge transition.

In one simple and efficient embodiment, the output switching circuitry may comprise a pullup transistor which pulls the output signal to the output high voltage level in response to the primary transition of one of the first and second intermediate signals, and a pulldown transistor which pulls the output transistor the output low voltage level in response to the primary transition of the other of the first and second intermediate signals. This arrangement provides a low area overhead. While for conciseness the present application will generally refer to a single pullup transistor or pulldown transistor, it will be appreciated that multiple pullup or pulldown transistors could also be used. It is not essential for one particular intermediate signal to be supplied to the pullup transistor and the other intermediate signal to the pulldown, since level shifting circuits can be devised in which either intermediate signal is provided to either of the pullup and pulldown transistors.

In one particularly advantageous embodiment, the level shifting circuitry may comprise an additional pullup transistor which selectively assists the pullup transistor in pulling the output signal to the output high voltage level and an additional pulldown transistor which selectively assists a pulldown transistor in pulling the output signal to the output low voltage level. When one of the pullup and pulldown transistors is being switched on in response to the primary transition of one intermediate signal, the other transistor is being switched off in response to the secondary transition of the other intermediate signal. Since the secondary transition is slower than the primary transition, the other transistor is switched off slowly and so there is a period during which the other transistor competes against the transistor being switched on, slowing the transition of the output signal. To speed up the transition of the output signal, the additional pullup transistor and additional pulldown transistor can be used to boost the pull of the transistor being switched on, so as to pull the output signal to its new value more quickly. This further increases the maximum operational frequency of the level shifting circuitry.

Additional pullup control circuitry may be provided to control the operation of the additional pullup transistor, and additional pulldown control circuitry may be provided to control the operation of the additional pulldown transistor. In advance of the primary transition of the first intermediate signal and the secondary transition of the second intermediate signal, the additional pullup control circuitry may couple the gate of the additional pullup transistor to one of the first intermediate signal and the second intermediate signal, and the additional pulldown control circuitry may decouple the gate of the additional pulldown transistor from the other of the first and second intermediate signals. This means that, when the primary transition of the one intermediate signal and the secondary transition of the other signal intermediate signal occur, then both the pullup transistor and the additional pullup transistor will become active and will compete with the pulldown transistor. The additional pulldown transistor will be inactive. Hence the combined drive strength of the pullup transistors is stronger than the drive strength of the pulldown transistor, and so the output signal is quickly pulled to the output high voltage level. Similarly, in response to the other transition, the additional pullup and pulldown control circuitry may configure the additional pullup and pulldown transistors so that the pulldown transistor and additional pulldown transistor compete against the pullup transistor to rapidly pull the output signal down to the output low voltage level. Hence, faster output signal transitions are achieved.

A delay circuit may be provided to delay the output signal, and the additional pullup control circuitry and the pulldown control circuitry may control whether a gate of the corresponding additional pullup transistor or additional pulldown transistor signal is coupled to the associated intermediate signal based on the delayed output signal. By delaying reconfiguring the additional pullup transistor and additional pulldown transistor relative to the transition of the output signal, a time window sufficient to allow latching of the output signal is provided before the additional transistors are reconfigured. On each transition of the output signal, one of the additional pullup and pulldown transistors may be activated for a period after the transition, and then become inactive. The delay of the delayed circuit can be tuned to correspond with the frequency of the level shifting circuitry.

In one example, the additional pullup control circuitry comprises a first pass gate which selectively couples the gate of the additional pullup transistor to the one of the first and second intermediate signals in response to the delayed output signal. Similarly, the additional pulldown control circuitry may comprise corresponding second pass gate. The pass gates selectively allow the first and second intermediate signals to be provided to the gate of the corresponding additional pullup or pulldown transistor.

The additional pullup control circuitry may also comprise a first cutoff transistor which switches off the additional pullup transistor in response to the delayed output signal. Similarly, the additional pulldown control circuitry may comprise a second cutoff transistor. The cutoff transistors deactivate the corresponding additional pullup or pulldown transistor after the output signal has transitioned and sufficient delay has occurred to allow the output signal to be latched, so that the corresponding additional transistor will be inactive on the following transistor to allow the opposite transistor to dominate.

The additional pullup transistor may have a greater drive strength than the pullup transistor and the additional pulldown transistor may have a greater drive strength than the pulldown transistor. The greater the drive strength of the additional pullup transistor and the additional pulldown transistor, the greater the boost provided by the additional transistors in pulling the output signal level to the output high voltage level or the output low voltage level, and hence the greater the frequency at which the level shifting circuitry can operate.

Viewed from another aspect, the present invention provides level shifting circuitry for generating an output signal in response to an input signal, said input signal having one of an input high voltage level and an input low voltage level, said output signal having one of an output high voltage level and an output low voltage level, said level shifting circuitry comprising:

first level shifting means for generating a first intermediate signal having a primary transition in response to a falling edge transition of said input signal and a secondary transition in response to a rising edge transition of said input signal, said falling edge transition comprising a transition from said input high voltage level to said input low voltage level and said rising edge transition comprising a transition from said input low voltage level to said input high voltage level; and second level shifting means for generating a second intermediate signal having a primary transition in response to said rising edge transition of said input signal and a secondary transition in response to said falling edge transition of said input signal; wherein:

said first level shifting means is configured to generate said primary transition of said first intermediate signal in response to said falling edge transition faster than said second level shifting means generates said secondary transition of said second intermediate signal in response to said falling edge transition;

said second level shifting means is configured to generate said primary transition of said second intermediate signal in response to said rising edge transition faster than said first level shifting means generates said secondary transition of said first intermediate signal in response to said rising edge transition; and said level shifting circuitry comprises output switching means for switching said output signal between said output high voltage level and said output low voltage level in response to said primary transition of said first intermediate signal and said primary transition of said second intermediate signal.

Viewed from yet another aspect, the present invention provides a method of generating an output signal in response to an input signal, said input signal having one of an input high voltage level and an input low voltage level, said output signal having one of an output high voltage level and an output low voltage level, said method comprising:

in response to a falling edge transition of said input signal from said input high voltage level to said input low voltage level, generating a primary transition of a first intermediate signal using a first level shifter and generating a secondary transition of a second intermediate signal using a second level shifter, said first level shifter generating said primary transition of said first intermediate signal in response to said falling edge transition faster than said second level shifter generates said secondary transition of said second intermediate signal in response to said falling edge transition;

in response to a rising edge transition of said input signal from said input low voltage level to said input high voltage level, generating a primary transition of said second intermediate signal using said second level shifter and generating a secondary transition of said first intermediate signal using said first level shifter, said second level shifter generating said primary transition of said second intermediate signal in response to said rising edge transition faster than said first level shifter generates said secondary transition of said first intermediate signal in response to said rising edge transition; and switching said output signal between said output high voltage level and said output low voltage level in response to said primary transition of said first intermediate signal and said primary transition of said second intermediate signal.

The above, and other objects, features and advantages of this invention will be apparent from the following detailed description of illustrative embodiments which is to be read in connection with the accompanying drawings.

DESCRIPTION OF THE EMBODIMENTS

Figure 2A:
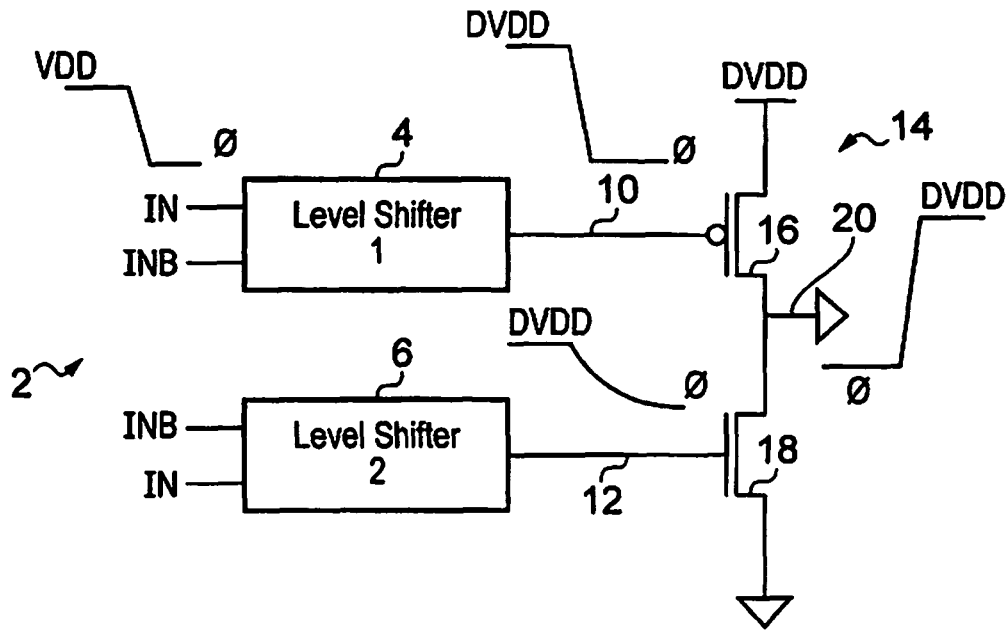
FIG. 2 schematically illustrates level shifting circuitry comprising a first level shifter and a second level shifter.

FIG. 2 illustrates level shifting circuitry 2 comprising a first level shifter 4 and a second level shifter 6. In response to an input signal IN, the first level shifter 4 generates a first intermediate signal 10 and the second level shifter 6 generates a second intermediate signal 12. The first and second intermediate signals 10, 12 are received by output switching circuitry 14 comprising a pullup transistor 16 and a pulldown transistor 18. In the example of FIG. 2 the pullup transistor 16 receives the first intermediate signal 10 and the pulldown transistor 18 receives the second intermediate signal 12, but it will be appreciated that it is equally possible for the first intermediate signal 10 to be provided to the pulldown transistor 18 and the second intermediate signal 12 provided to the pullup transistor 16.

As shown in part (A) of FIG. 2, in response to a falling edge transition of the input signal IN the first level shifter 4 generates a primary transition of the first intermediate signal 10 and the second level shifter 6 generates a secondary transition of the second intermediate signal 12. The primary transition of the first intermediate signal 10 occurs more rapidly than the secondary transition of the second intermediate signal 12. On the other hand, part (B) of FIG. 2 shows that in response to a rising edge of the input signal IN, the first level shifter 4 generates a secondary transition of the first intermediate signal 10 and the second level shifter 6 generates a primary transition of the second intermediate signal 12. The primary transition of the second intermediate signal 12 is faster than the secondary transition of the first intermediate signal 10.

Hence, the first level shifter 4 is faster in response to the falling edge of the input signal IN and the second level shifter 6 is faster in response to the rising edge of the input signal. The pullup transistor 16 and the pulldown transistor 18 are controlled in response to the primary transition of the corresponding intermediate signal 10, 12. Hence, a fast transition of the output signal 20 is generated in response to both a rising edge and a falling edge of the input signal IN. Therefore, the level shifting circuitry 2 can be used at higher frequencies than the known level shifter.

Figure 3A:
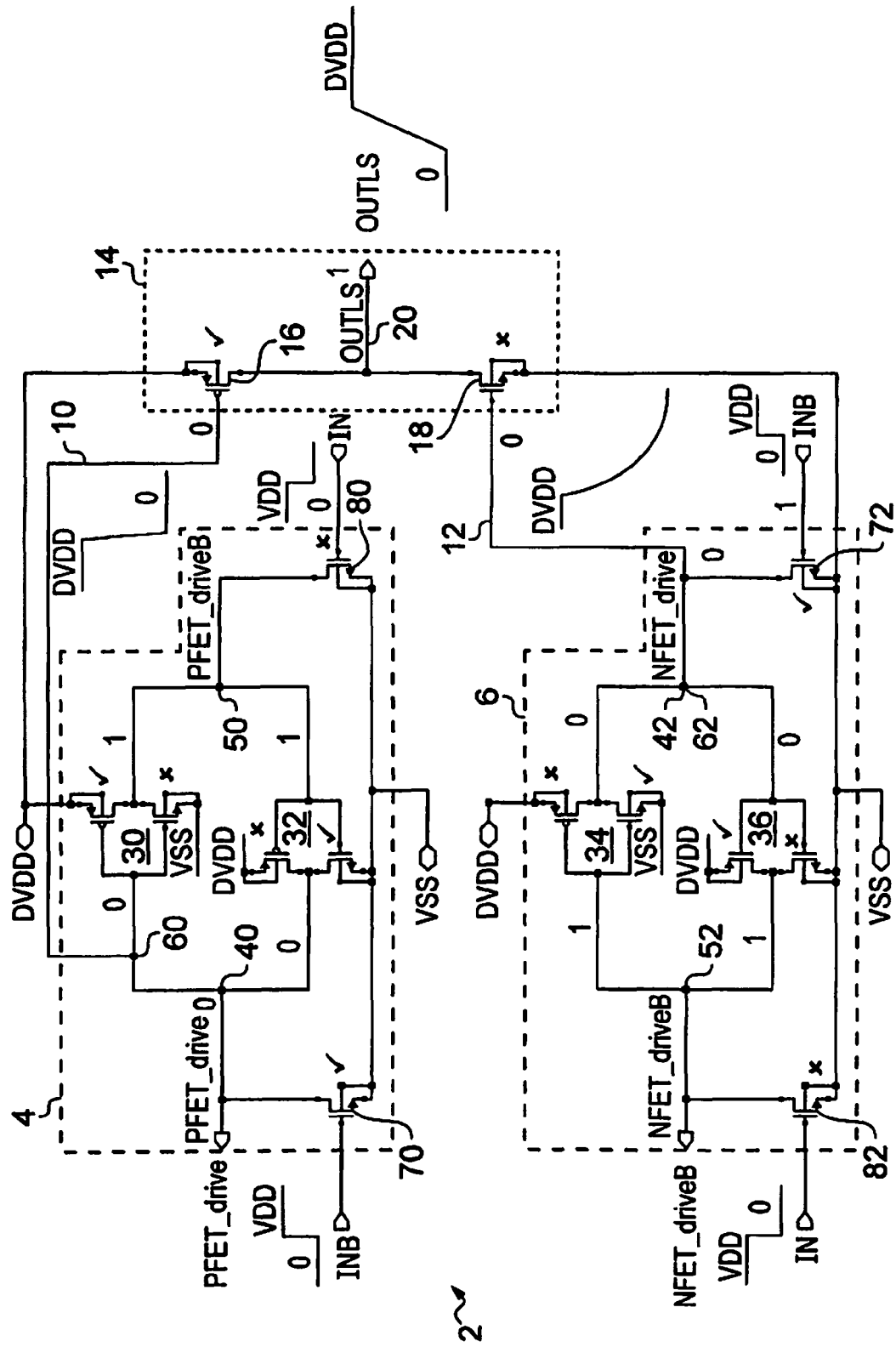
FIGS. 3A and 3B illustrate an example configuration of the level shifting circuitry.
Figure 3B:
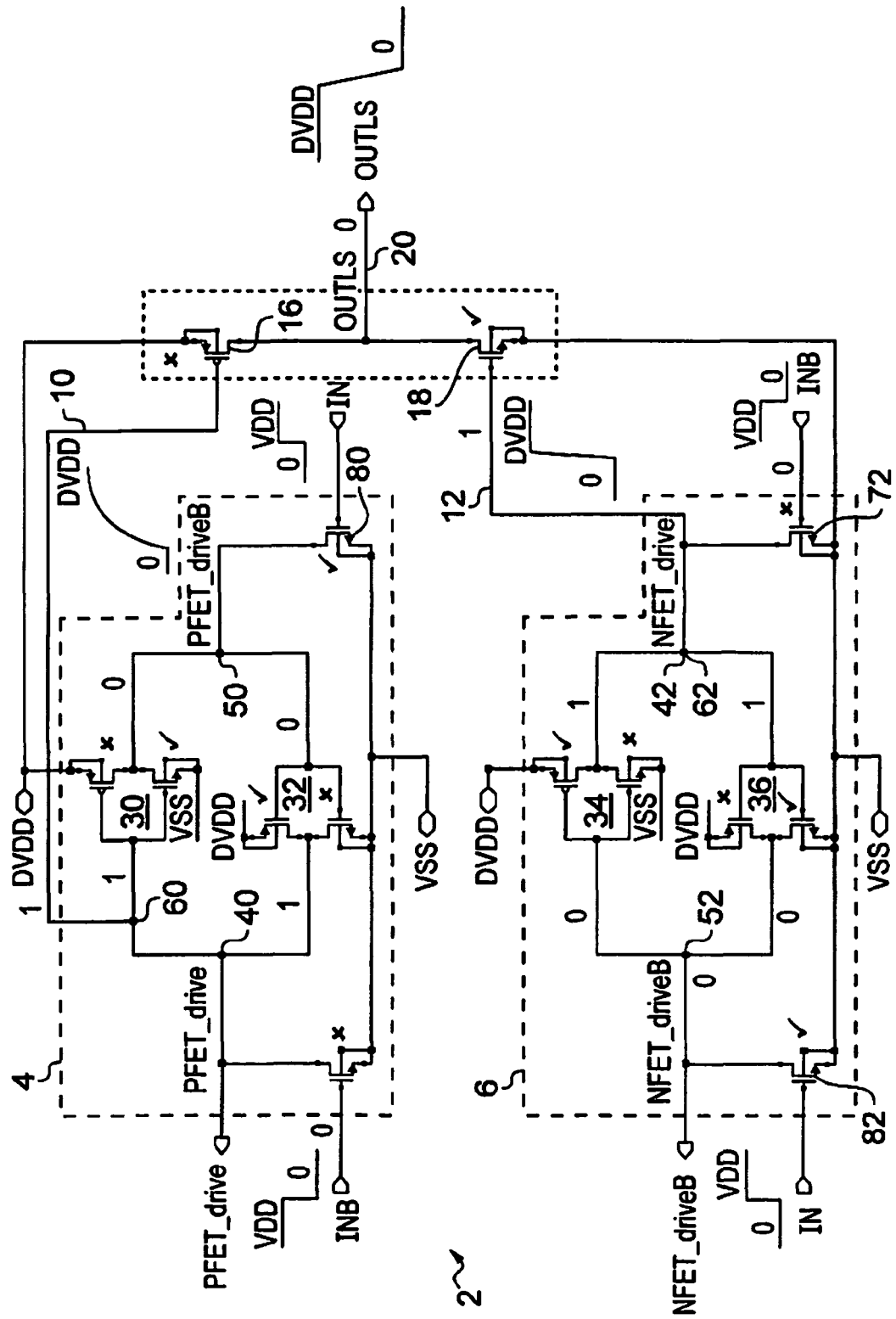

FIGS. 3A and 3B show an embodiment of the level shifting circuitry 2 in more detail. FIG. 3A shows the operation of the level shifting circuitry 2 in response to a falling edge of the input signal IN and FIG. 3B shows the operation of the level shifting circuitry 2 in response to a rising edge of the input signal.

In the embodiment of FIGS. 3A and 3B, the first level shifter 4 and the second level shifter 6 each comprise a feedback loop (also known as a memory point or retention loop), comprising a ring of inverters 30, 32, 34, 36. Although for conciseness FIGS. 3A and 3B illustrate two inverters in each feedback loop, it is possible to provide feedback loops with more inverters as desired. Each feedback loop comprises a falling edge input point 40, 42, a rising edge input point 50, 52, and an intermediate signal output point 60, 62. In the second level shifter 6, the same point of the feedback loop functions as both the falling edge input point 42 and the intermediate signal output point 62, but this is not essential and separate input and output points may also be provided.

The falling edge input point 40, 42 of each feedback loop is used to input an initialising value into the feedback loop in response to a falling edge of the input signal IN. The falling edge input point 40, 42 of each feedback loop is coupled to a power line VSS via a first gating transistor 70, 72. A signal INB, which is the inverse of the input signal IN, is applied to the gates of the n-type gating transistor 70, 72. On a falling edge of the input signal IN, that is a rising edge of the inverse input signal INB, the gating transistor 70, 72 is turned on thus supplying the low voltage level from the VSS power supply line to the falling edge input point 40, 42 as shown in FIG. 3A. This causes the feedback loop of the first and second level shifters 4, 6 to be placed in the first state. In the feedback loop of the first level shifter 4, the nodes 40, 60 are at a low voltage level and node 50 is at a high voltage level. In the feedback loop of the second level shifter 6, the node 52 is at a high voltage level while node 42, 62 is at a low voltage level. This causes the first intermediate signal 10 and the second intermediate signal 12 to switch to a low voltage level, turning on pullup transistor 16 and turning off pulldown transistor 18. Hence, the output signal 20 is pulled to a high voltage level DVDD by pullup transistor 16.

On the other hand, FIG. 3B shows the response of the level shifting circuits to a rising edge of the input signal IN. The rising edge input point 50, 52 is coupled to the VSS line via a second gating transistor 80, 82. The second gating transistor 80, 82 has its gate coupled to the input signal IN. Hence, on the rising edge of the input signal IN, the n-type gating transistor 80, 82 is turned on, thus supplying the low voltage level from the VSS line to the rising edge input point 50, 52 of each feedback loop. This sets the feedback loop of each level shifter 4, 6 to a second state. In the first level shifter 4, the nodes 40, 60 are at a high voltage level and node 50 is at a low voltage level, while in the second level shifter node 52 is at a low voltage level and the nodes 42, 62 are at a high voltage level. This causes the first and second intermediate signals 10, 12 to transition to a high voltage level, turning off the pullup transistor 16 and turning on the pulldown transistor 18. Therefore, the output signal 20 is pulled down to the low voltage level by the pulldown transistor 18.

The transistor sizes and signal paths of the first and second level shifters 4, 6 are designed so that the first level shifter 4 responds more quickly to a falling edge of the input signal IN than the second level shifter 6, and the second level shifter 6 responds more quickly to a rising edge of the input signal IN than the first level shifter 4. Therefore, the pulldown transistor 18 is turned on quickly by the second level shifter 6 in response to a rising edge of the input signal and the pullup transistor 16 is turned on quickly by the first level shifter 4 in response to a falling edge of the input signal. Hence, the output signal 20 transitions quickly in response to both edges of the input signal.

While FIGS. 3A and 3B show a particular arrangement of n-type and p-type transistors, it will be appreciated that alternative arrangements can be designed using transistors of the opposite type. Moreover, other designs of level shifter can be devised in which the level shifters respond more quickly to the rising and falling edges of the input signal respectively.

Also, while FIGS. 3A and 3B show the intermediate signals 10, 12 being generated with a rising edge transition corresponding to a rising edge transition of the input signal IN and a falling edge transition corresponding to a falling edge of the input signal IN, it is also possible to invert the intermediate signals 10, 12 so that the falling edge corresponds to the rising edge of the input signal and the rising edge corresponds to the falling edge of the input signal. Similarly, the relationship between an edge of the intermediate signal and an edge of the output signal can also be inverted.

The embodiment of FIGS. 3A and 3B achieves an increase in the operational frequency of which the level shifter can operate, because each level shifter 4, 6 can be designed to respond quickly when generating the primary transition without needing to compromise the design to also provide a quick response when generating the secondary transition. By switching the output in response to the respective primary transitions, the output signal can be switched quickly in response to both the rising edge and the falling edge of the input signal, thus avoiding the limitation in frequency caused by the slow response to one edge as described above with respect to FIGS. 1A and 1B.

The operational frequency of the level shifting circuitry can further be increased using the embodiment of FIGS. 4A to 4D. In the embodiment of FIGS. 3A and 3B, while one of the pullup and pulldown transistors 16, 18 is being switched on quickly, the other transistor 16, 18 is being switched off slowly, and so remains on to some extent. This reduces the speed with which the one of the pullup and pulldown transistors 16, 18 being turned on can pull the output signal to its new value. In the embodiment of FIGS. 4A to 4D, the competing pull of the transistor being turned off is overcome by boosting the pull of the transistor being turned on, so as to increase the speed with which the output signal is switched.

FIGS. 4A to 4D show level shifting circuitry 100 comprising first and second level shifters 4, 6 as shown in FIGS. 2A, 2B, 3A and 3B. As in the earlier embodiment, a pullup transistor 16 and a pulldown transistor 18 are switched in response to the intermediate signals 10, 12 generated by the first and second level shifters 4, 6.

An additional pullup transistor 106 is provided in parallel with the pullup transistor 16, and an additional pulldown transistor 108 is provided in parallel with the pulldown transistor 18. The additional pullup transistor 106 and additional pulldown transistor 108 have a greater drive strength than the pullup transistor 16 and pulldown transistor 18, and selectively assist the pullup and pulldown transistor 16, 18 in pulling the output signal 20 to the high and low output values.

The additional pullup transistor 106 is coupled to the first intermediate signal 10 via additional pullup control circuitry 110. The additional pullup control circuitry 110 controls whether or not the gate of the additional pullup transistor 106 is coupled to the first intermediate signal 10 or not. The additional pullup control circuitry comprises a first pass gate PG1 which controls whether or not the gate of the additional pullup transistor 106 is coupled to the first intermediate signal 10, and a first switch off transistor Poff for switching off the additional pullup transistor 106.

Similarly, the additional pulldown transistor 108 is coupled to the second intermediate signal 12 via additional pulldown control circuitry 112 comprising a second pass gate PG2 for controlling whether or not the gate of the additional pulldown transistor 108 is coupled to the second intermediate signal 12, and a second switch off transistor Noff for switching off the additional pulldown transistor 108.

The level shifting circuitry 100 also comprises a delay circuit 120 for delaying the output signal 20. The delayed output signal controls the operation of the additional pullup control circuitry 110 and the additional pulldown circuitry 112. In this example, the delay circuit 120 comprises three inverters 122, although other numbers of inverters, or other kinds of delaying elements, may also be used. Although FIGS. 4A to 4D illustrate the delayed output signal being output from the level shifting circuitry 100 as an output signal OUT for use by subsequent circuitry, it is also possible to tap the output signal at the node 20 between the pullup and pulldown transistors 16, 18 for output to subsequent circuits.

Figure 4A:
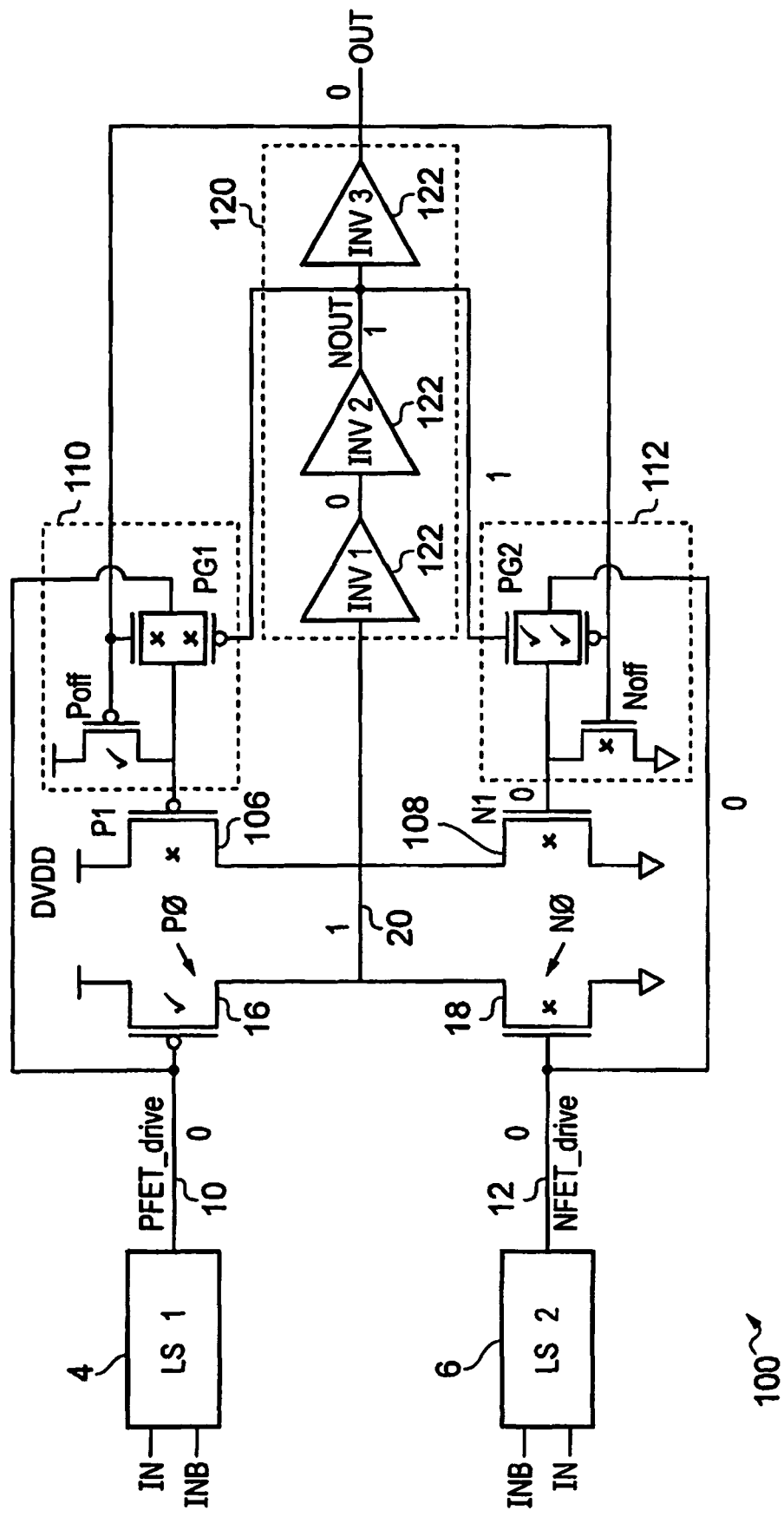
FIGS. 4A, 4B, 4C and 4D illustrate respective states of level shifting circuitry having additional pullup and pulldown transistors for assisting pullup and pulldown transistors in pulling the output signal to its high and low values.

FIGS. 4A to 4D illustrate successive states of the level shifting circuitry 100 as the levels of the first and second intermediate signals 10, 12 change. In FIG. 4A the first and second intermediate signals 10, 12 are at a low level, and so output signal 20 is held high by pullup transistor 16. The delayed output signal produced by the delay circuit 120 holds the second pass gate PG2 open, coupling the gate of the additional pulldown transistor 108 to the second intermediate signal 12. The first pass gate PG1 is closed and so the additional pullup transistor 106 is not coupled to the first intermediate signal 10.

Figure 2B:
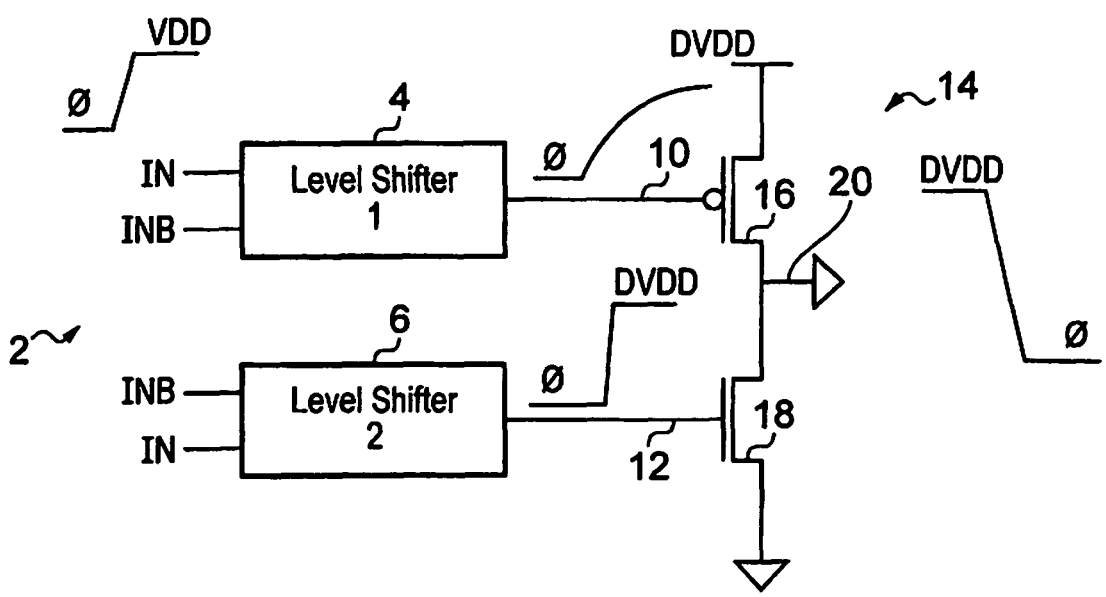
Figure 4B:
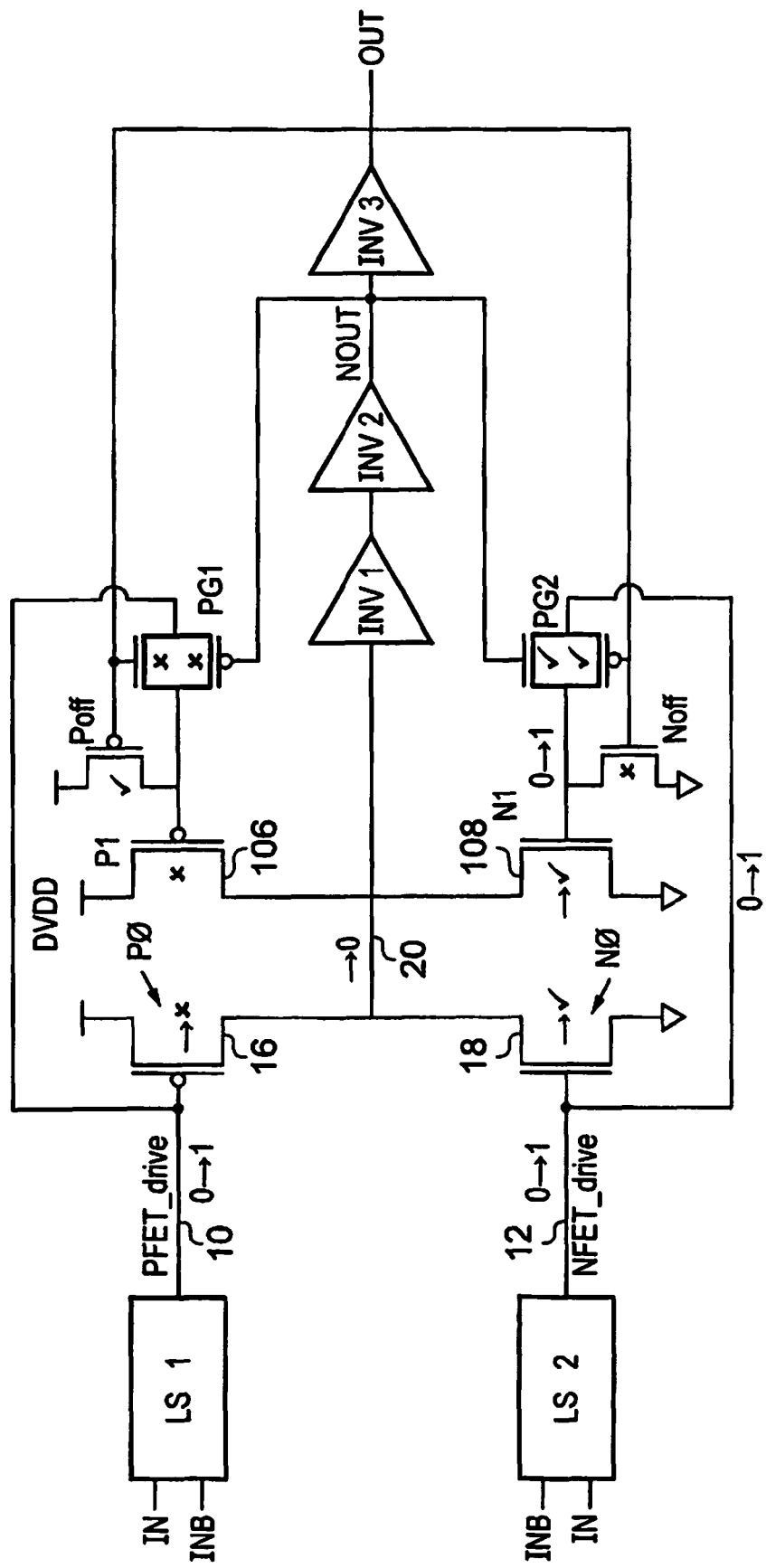

As shown in FIG. 4B, when the first and second intermediate signals 10, 12 transition to a high level (for example, in response to a rising edge of the input signal as shown in FIG. 2B), then the pullup transistor 16 is turned off as the pulldown transistor 18 and the additional pulldown transistor 108 are turned on. Since pass gate PG1 is off, the additional pullup transistor 106 remains off. Hence, the pulldown transistor 18 and additional pulldown transistor 108 are in competition with the pullup transistor 16. Since the combined drive strength of the pulldown transistor 18 and additional pulldown transistor 108 is greater than the drive strength of the pullup transistor 60, the output signal 20 is brought quickly to the output low voltage level.

Figure 4C:
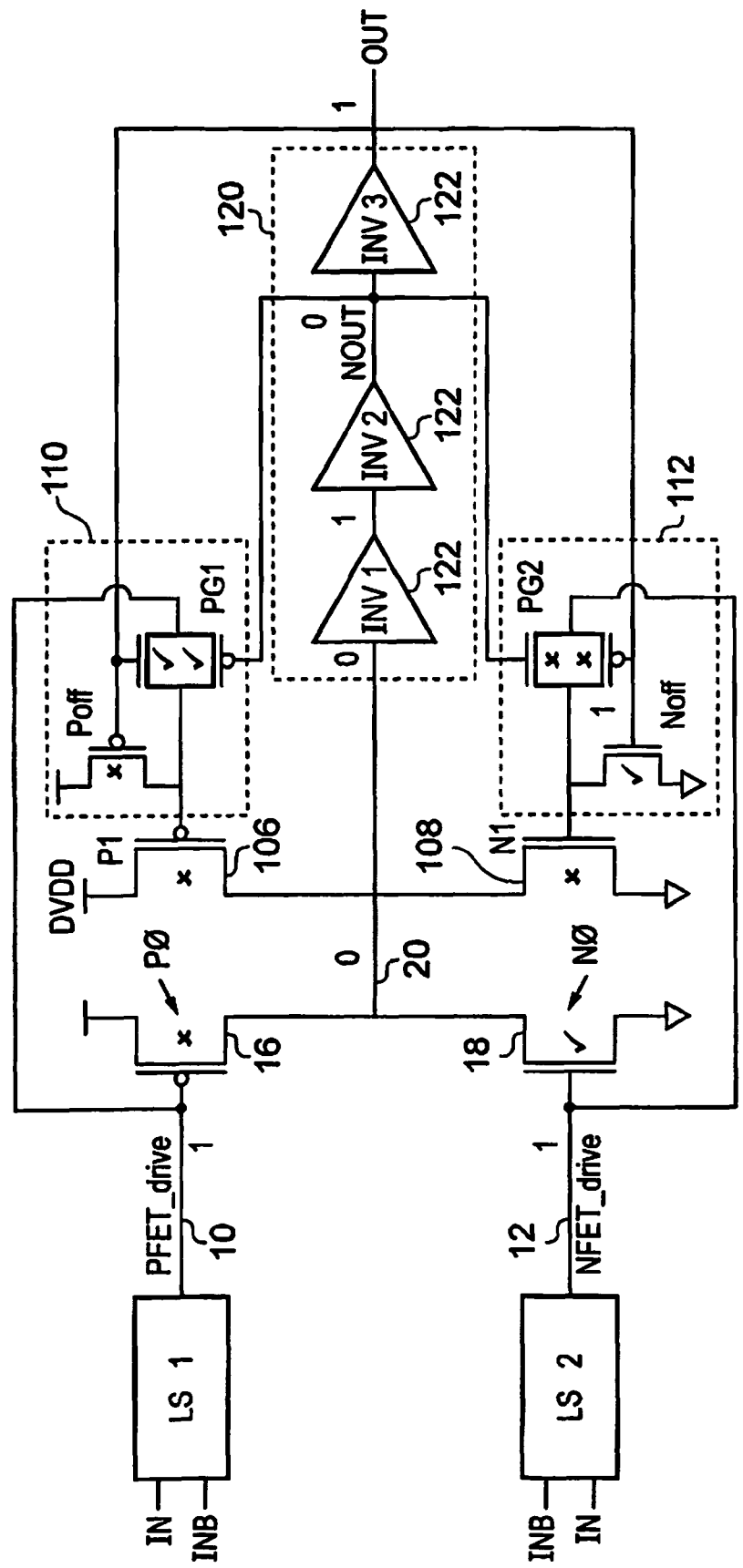

After a small delay, the duration of which depends on the signal propagation delay through the delay circuitry 120, the output signal 20 propagates through the delay circuit 120 and causes the additional pullup control circuitry 110 and additional pulldown control circuitry 112 to switch as shown in FIG. 4C. The second pass gate PG2 switches off, decoupling the additional pulldown transistor 108 from the second intermediate signal 12. The second switch off transistor Noff turns on, thus switching off the additional pulldown transistor 108. The first pass gate PG1 opens, coupling the gate of the additional pullup transistor 106 to the first intermediate signal 10. The first switch off transistor Poff switches off so that it no longer forces the additional pullup transistor 106 to remain off. For now, the additional pullup transistor 106 remains off because the first intermediate signal 10 supplied to the gate of the additional pullup transistor 106 via the pass gate PG1 remains high.

Figure 4D:
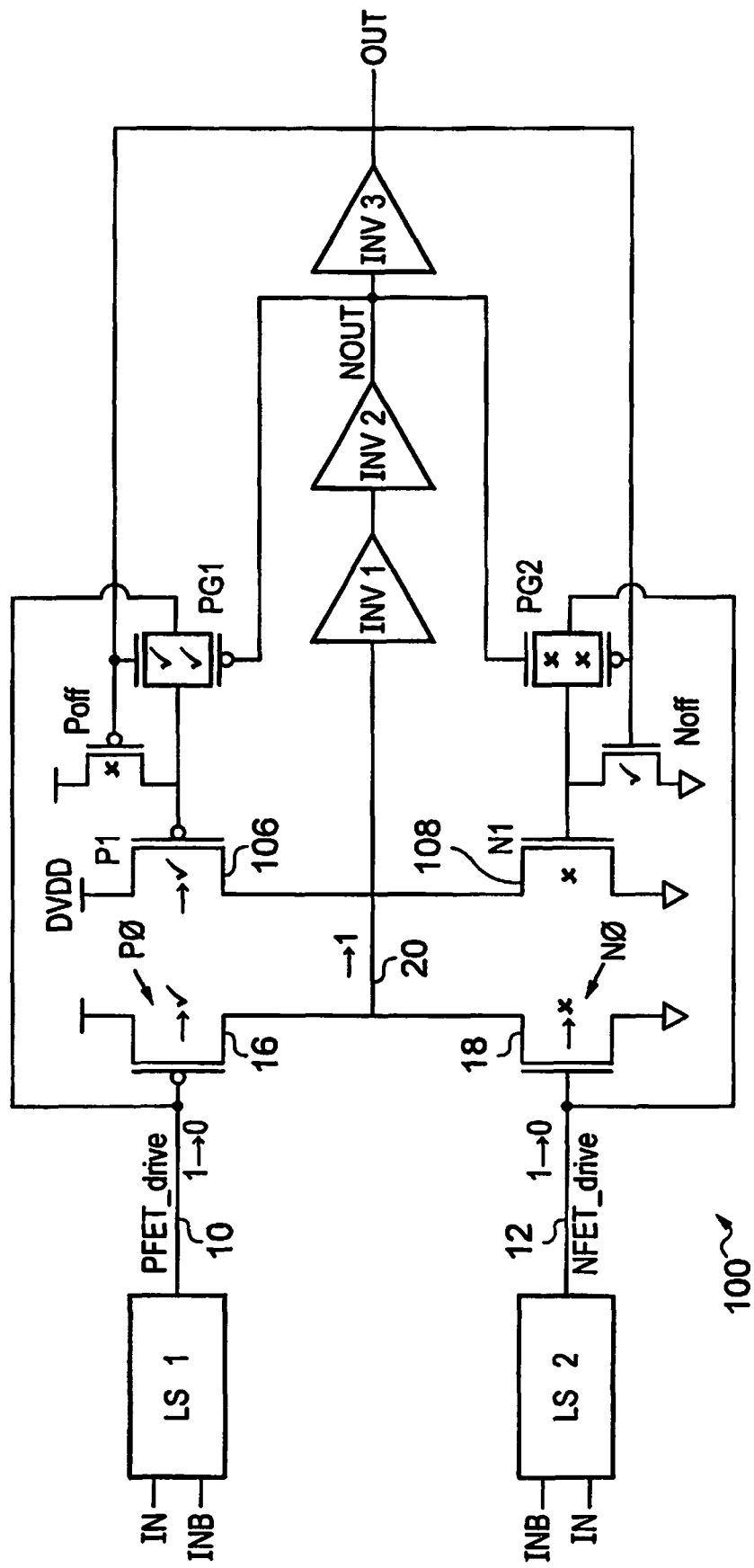

However, when the first and second intermediate signals 10, 12 transition back to the low state as shown in FIG. 4D, then the pass gate PG1 propagates the transition through to the gate of the additional pullup transistor 106 and so the additional pullup transistor 106 is turned on together with the pullup transistor 16. The additional pulldown transistor 108 remains off. Hence, in the state shown in FIG. 4D the pullup transistor 16 and the additional pullup transistor 106 together compete against the pulldown transistor 18. Thus, the greater pullup drive strength pulls the output signal 20 rapidly to the output high voltage level.

Once the output signal 20 has propagated through the delay circuitry 120 to switch the additional pullup and pulldown control circuitry 110, 112, the circuit 100 returns to the state shown in FIG. 4A.

Hence, by providing the additional pullup and pulldown transistors 106, 108 and the associated control circuitry 110, 112, the pullup and pulldown drive strength can be boosted for a short period to overcome the competing pull of the opposite transistor. This enables the output signal 20 to transition more rapidly, enabling the level shifting circuitry 100 to operate at high frequencies.

Moreover, the circuitry 100 has no DC current leakage, since in any series of transistors coupled between the DVDD and ground voltage rails, at least one transistor will be off at any time.

Again, while FIGS. 4A to 4D show the first intermediate signal 10 being provided to the pullup transistors 16, 106 and the second intermediate signal 12 being provided to the pulldown transistors 18, 108, the first and second intermediate signals 10, 12 could also be exchanged and provided to the opposite ones of the pullup and pulldown transistors.

Figure 1A:
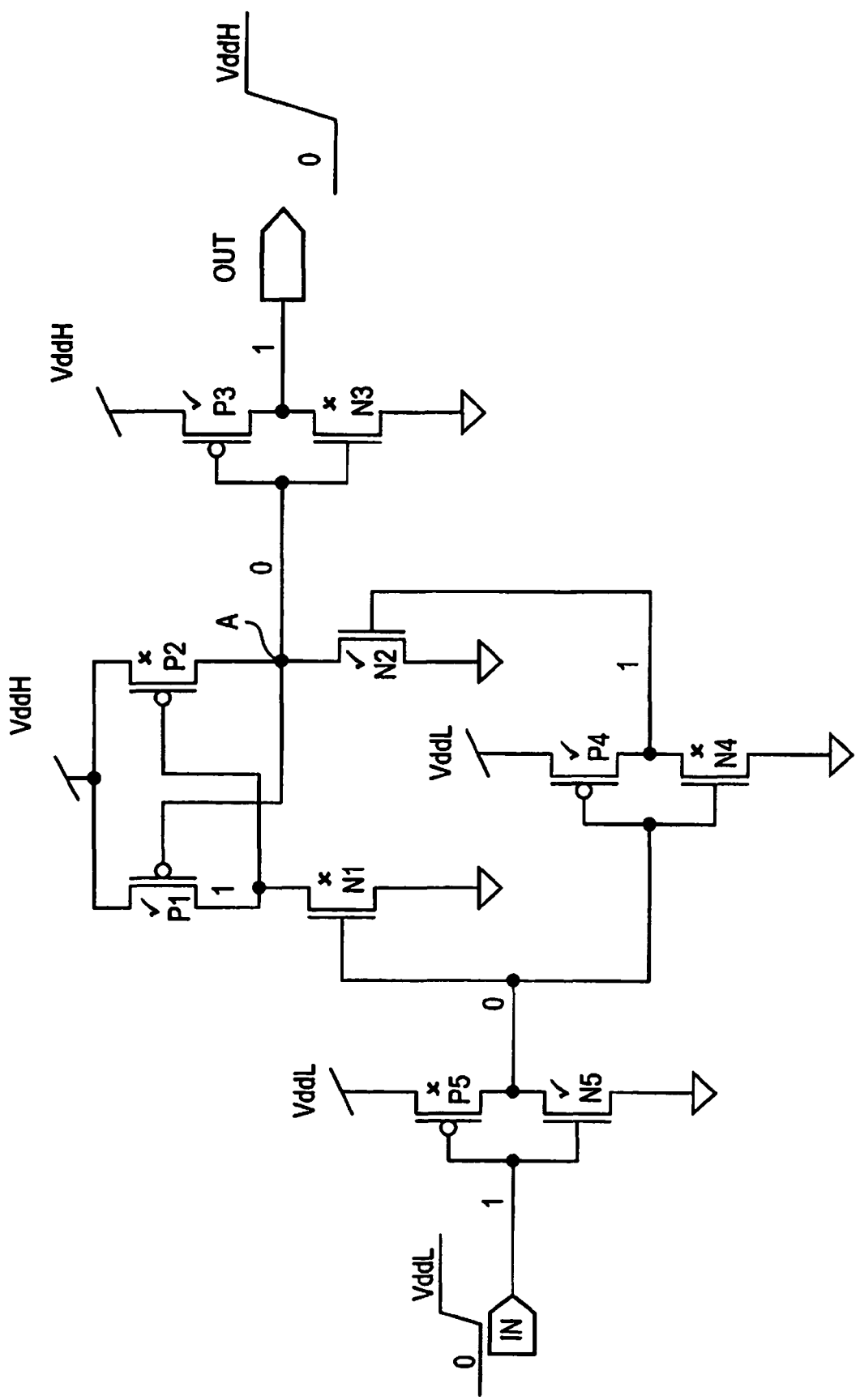
FIG. 1A illustrates the operation of a known level shifter in response to a rising edge of an input signal.
Figure 1B:
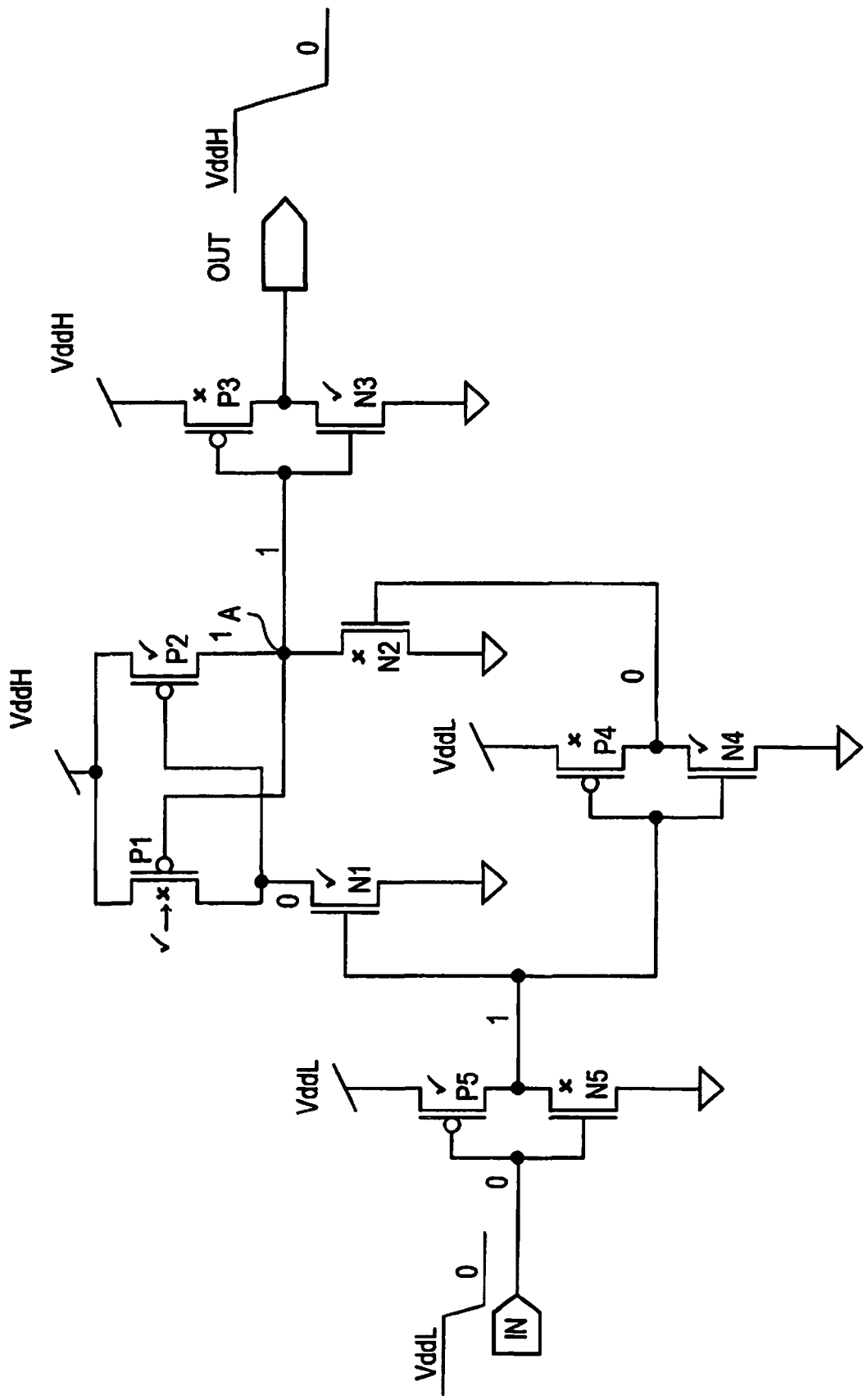
FIG. 1B illustrates the operation of a known level shifter in response to a falling edge of an input signal.
Figure 5:
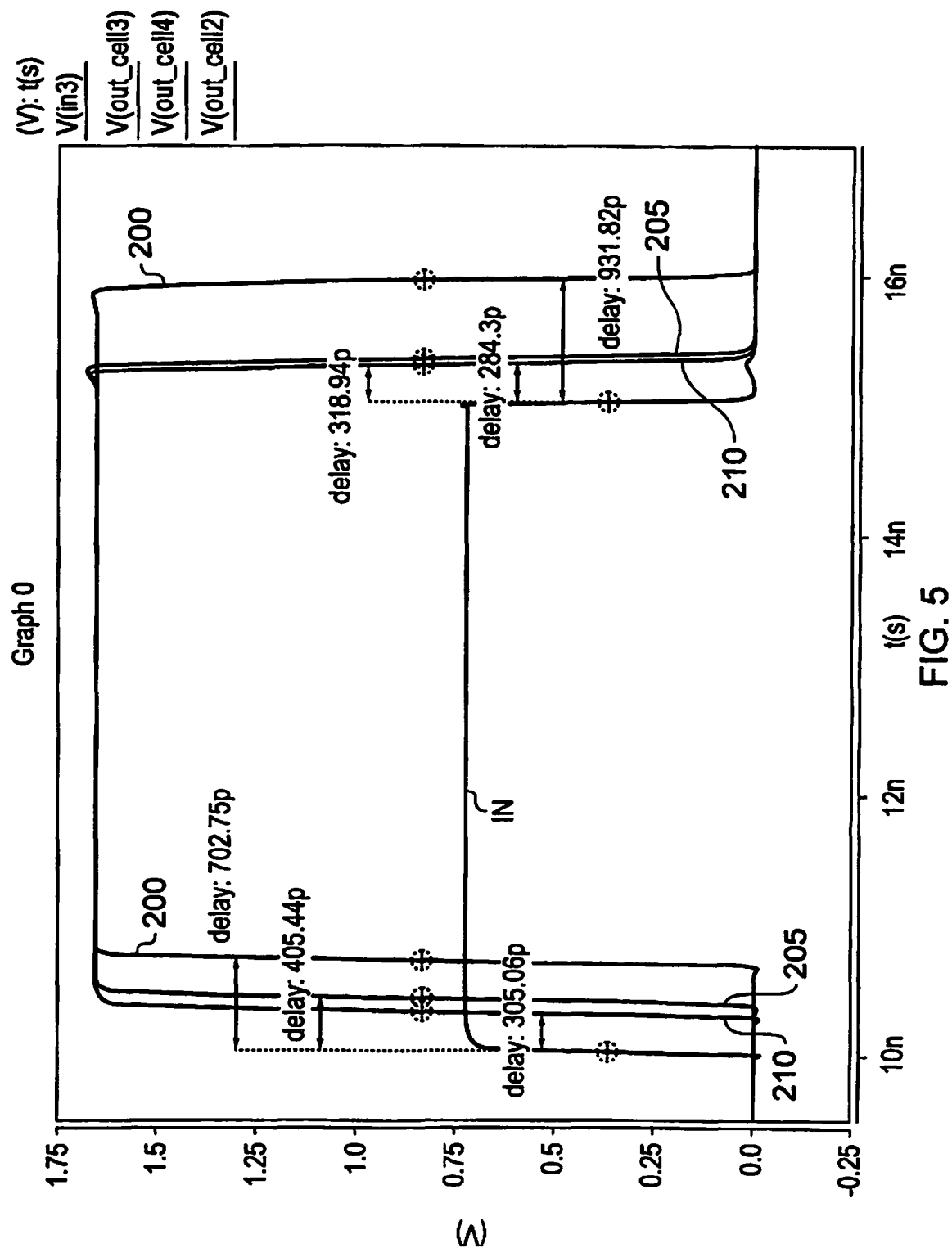
FIG. 5 illustrates simulation results for the level shifting circuitry shown in FIGS. 1A and 1B, 3A and 3B and 4A to 4D respectively.

FIG. 5 is a graph showing simulation results for the level shifters of the type shown in FIGS. 1, 3 and 4. The simulation was performed at a frequency of 100 MHz to allow a comparison with the known technology. The simulation assumes worst case conditions with 28 nm bulk technology at a temperature of −40° C., with an input low voltage level of 0.72 V and an output high voltage level of 1.65 V. Line IN shows the input signal. Line 200 shows the output signal generated in response to the input signal by the level shifter of the known type shown in FIGS. 1A and 1B. Line 205 shows the output signal generated by level shifting circuitry 2 as shown in FIGS. 3A and 3B. Line 210 shows the output signal generated by level shifter circuitry according to the embodiment of FIGS. 4A to 4D.

As shown in FIG. 5, for the embodiments of FIGS. 3A and 3B and FIGS. 4A to 4D, the response delay on both a rising edge and a falling edge of the input signal is shorter than for the level shifter shown in FIGS. 1A and 1B. The level shifter of FIGS. 1A and 1B is constrained by the slower of the transitions, i.e. a delay of 931.82 picoseconds as shown in FIG. 5 for the falling edge transition. Accordingly, the level shifter of FIGS. 1A and 1B is limited to a frequency at which this delay can be accommodated. Moreover, the response on the rising edge is also relatively slow, since the design cannot be optimised for the rising edge transition because it is also necessary to consider the response of the same level shifter to the falling edge transition. In contrast, for the level shifters shown in FIGS. 3 and 4, the delay is much shorter because each transition of the output signal is generated by a different level shifter which can be designed specially to handle that transition without considering the response speed of the other transition.

Figure 6:
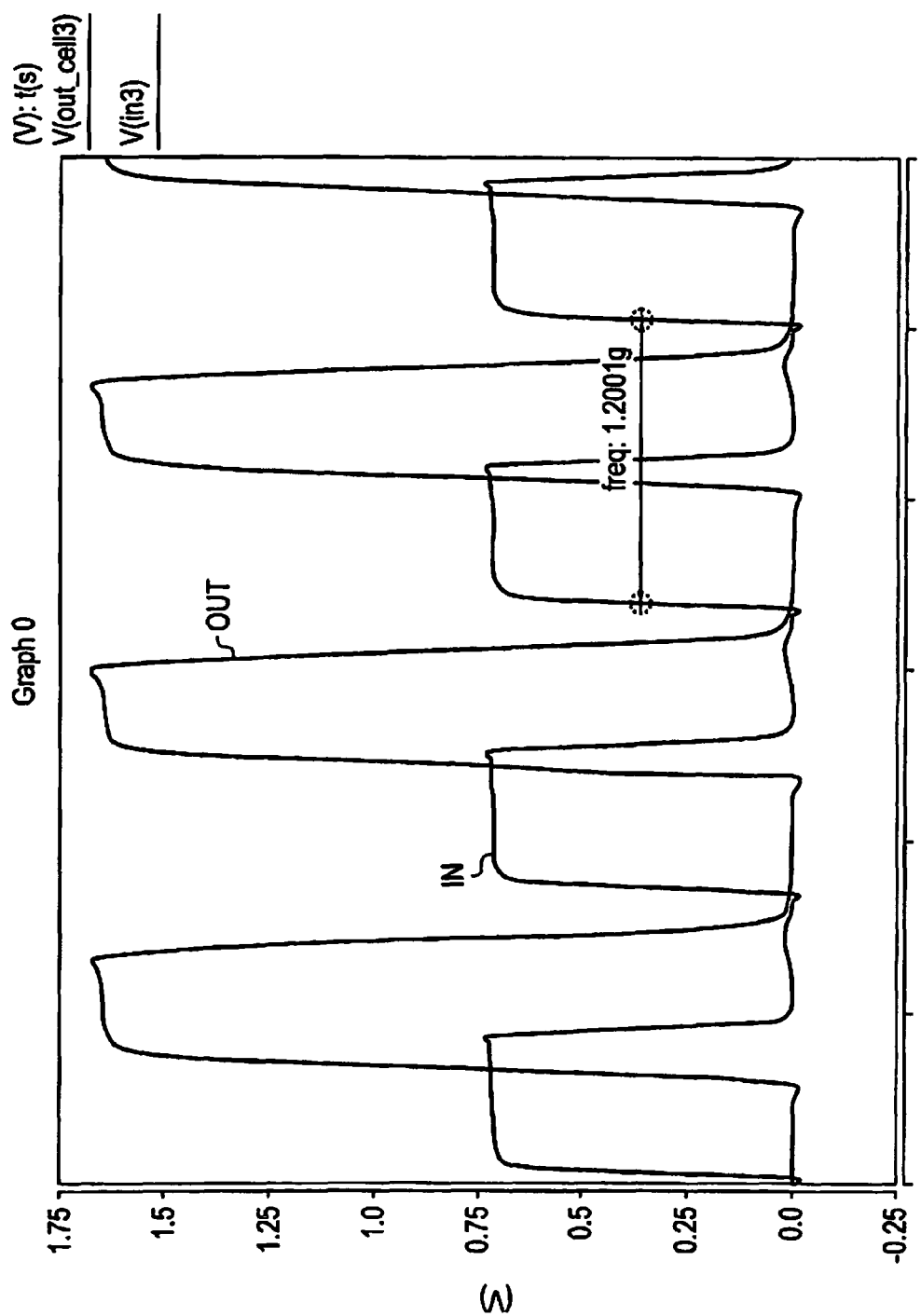
FIG. 6 illustrates results of a simulation of the operation of the level shifting circuitry shown in FIGS. 4A to 4B.

FIG. 6 shows a further simulation result showing the output signal OUT generated by the level shifter of FIGS. 4A to 4D in response to the input signal IN. The simulation is performed at the same conditions as in FIG. 5, except that the frequency is increased to 1.2 GHz. As shown in FIG. 6, the response of the level shifter of FIGS. 4A to 4D to both rising and falling edges of the input signal is fast enough to allow the level shifter to operate at 1.2 GHz, faster than the level shifter of FIGS. 1A and 1B.

Figure 7:
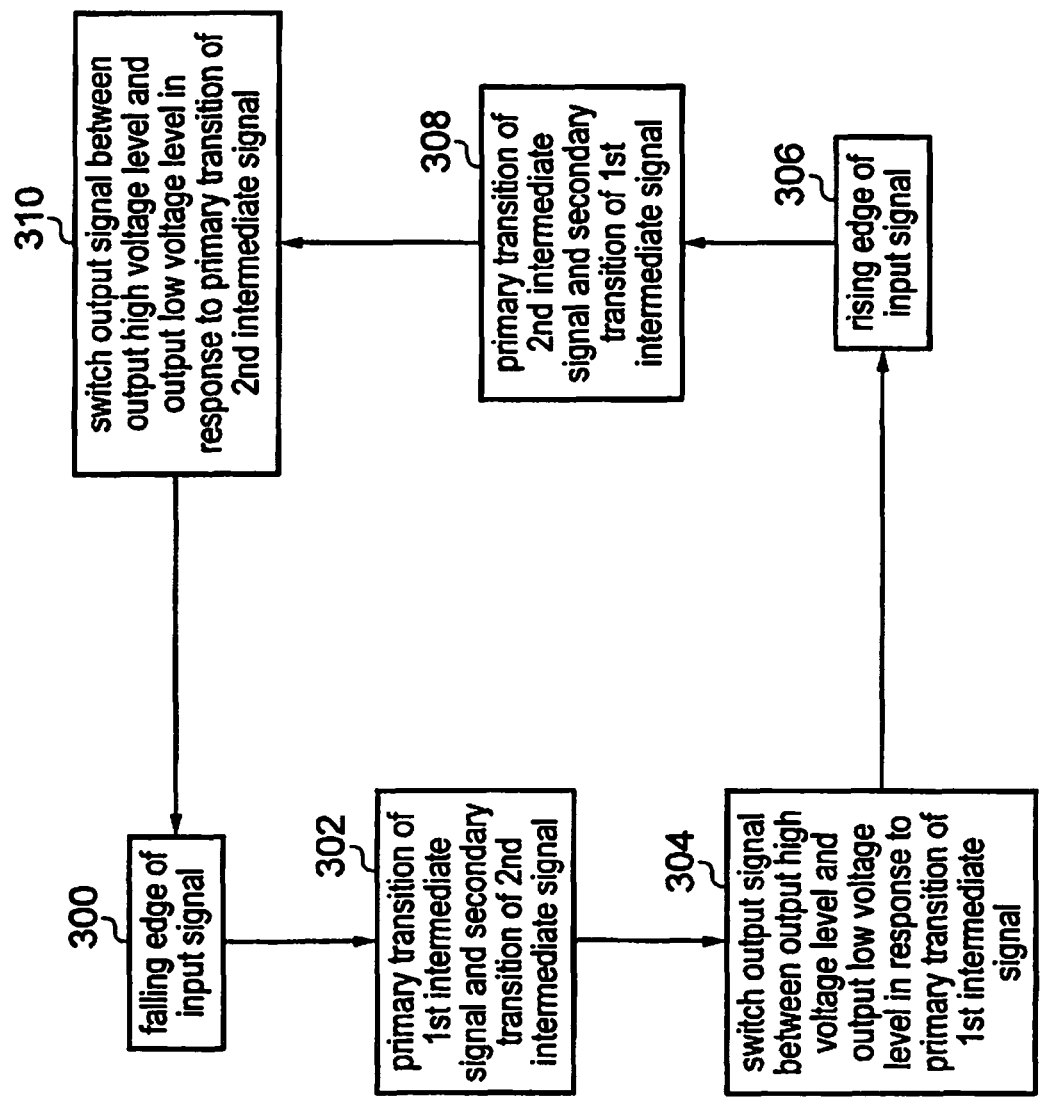
FIG. 7 illustrates a level shifting method.

FIG. 7 shows a level shifting method for converting an input signal having one of an input low voltage level and an input high voltage level into an output signal having one of an output high voltage level and an output level voltage level. At step 300, a falling edge of the input signal occurs. In response to the falling edge, the first level shifter generates a primary transition of the first intermediate signal and the second level shifter generates a secondary transition of the second intermediate signal (step 302). The first level shifter 4 generates the primary transition with a smaller delay than the second level shifter 6 generates the secondary transition. At step 304, the output switching circuitry 14 switches the output signal between the output high voltage level and output low voltage level in response to the primary transition of the first intermediate signal.

At step 306, a rising edge of the input signal then occurs. In response to the rising edge, the second level shifter 6 generates a primary transition of the second intermediate signal 12 and the first level shifter 4 generates a secondary transition of the first intermediate signal 10 (step 308). The primary transition of the second intermediate signal is generated in response to the rising edge of the input signal with a smaller delay than the secondary transition of the first intermediate signal. At step 310, the output switching circuitry 14 switches the output signal between the output high voltage level and output low voltage level in response to the primary transition of the second intermediate signal 12. The method then returns to step 300 where a falling edge of the input signal occurs once more.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Level shifting circuitry for generating an output signal in response to an input signal, said input signal having one of an input high voltage level and an input low voltage level, said output signal having one of an output high voltage level and an output low voltage level, said level shifting circuitry comprising:

a first level shifter configured to generate a first intermediate signal having a primary transition in response to a falling edge transition of said input signal and a secondary transition in response to a rising edge transition of said input signal, said falling edge transition comprising a transition from said input high voltage level to said input low voltage level and said rising edge transition comprising a transition from said input low voltage level to said input high voltage level; and a second level shifter configured to generate a second intermediate signal having a primary transition in response to said rising edge transition of said input signal and a secondary transition in response to said falling edge transition of said input signal; wherein:

said first level shifter is configured to generate said primary transition of said first intermediate signal in response to said falling edge transition faster than said second level shifter generates said secondary transition of said second intermediate signal in response to said falling edge transition;

said second level shifter is configured to generate said primary transition of said second intermediate signal in response to said rising edge transition faster than said first level shifter generates said secondary transition of said first intermediate signal in response to said rising edge transition; and said level shifting circuitry comprises output switching circuitry configured to switch said output signal between said output high voltage level and said output low voltage level in response to said primary transition of said first intermediate signal and said primary transition of said second intermediate signal, wherein said first level shifter comprises a first feedback loop configured to retain signal vales in one of a first state and a second state in dependence on said input signal, said first intermediate signal being obtained from the signal value at a first intermediate output point of said first feedback loop, and said second level shifter comprises a second feedback loop configured to retain signal values in one of said first state and said second state in dependence on said input signal, said second intermediate signal being obtained from the signal value at a second intermediate output point of said second feedback loop.

2. The level shifting circuitry according to claim 1, wherein a difference between said output high voltage level and said output low voltage level is greater than a difference between said input high voltage level and said input low voltage level.

3. The level shifting circuitry according to claim 1, wherein said first feedback loop and said second feedback loop each comprise a falling edge input point for inputting an initialising signal value in response to said falling edge transition of said input signal and a rising edge input point for inputting an initialising signal value in response to said rising edge transition of said input signal, said first feedback loop and said second feedback loop being configured in said one of said first state and said second state in dependence on whether said initialising value is input at said falling edge input point or said rising edge input point.

4. The level shifting circuitry according to claim 3, wherein said first feedback loop and said second feedback loop each comprise a first gating device for selectively coupling said falling edge input point to a voltage supply in response to said falling edge transition of said input signal, and a second gating device for selectively coupling said rising edge input point to said voltage supply in response to said rising edge transition of said input signal.

5. The level shifting circuitry according to claim 1, wherein said output switching circuitry comprises:
 a pullup transistor configured to pull said output signal to said output high voltage level in response to said primary transition of one of said first intermediate signal and said second intermediate signal; and
 a pulldown transistor configured to pull said output signal to said output low voltage level in response to said primary transition of the other of said first intermediate signal and said second intermediate signal.

6. The level shifting circuitry according to claim 5, comprising an additional pullup transistor configured to selectively assist said pullup transistor in pulling said output signal to said output high voltage level; and
 an additional pulldown transistor configured to selectively assist said pulldown transistor in pulling said output signal to said output low voltage level.

7. The level shifting circuitry according to claim 6, comprising additional pullup control circuitry configured to couple a gate of said additional pullup transistor to said one of said first intermediate signal and said second intermediate signal in advance of said primary transition of said one of said first intermediate signal and said second intermediate signal, and to decouple said gate of said additional pullup transistor from said one of said first intermediate signal and said second intermediate signal in advance of said secondary transition of said one of said first intermediate signal and said second intermediate signal; and
 additional pulldown control circuitry configured to couple a gate of said additional pulldown transistor to said other of said first intermediate signal and said second intermediate signal in advance of said primary transition of said other of said first intermediate signal and said second intermediate signal, and to decouple said gate of said additional pulldown transistor from said other of said first intermediate signal and said second intermediate signal in advance of said secondary transition of said other of said first intermediate signal and said second intermediate signal.

8. Level shifting circuitry for generating an output signal in response to an input signal, said input signal having one of an input high voltage level and an input low voltage level, said output signal having one of an output high voltage level and an output low voltage level, said level shifting circuitry comprising:
 a first level shifter configured to generate a first intermediate signal having a primary transition in response to a falling edge transition of said input signal and a secondary transition in response to a rising edge transition of said input signal, said falling edge transition comprising a transition from said input high voltage level to said input low voltage level and said rising edge transition comprising a transition from said input low voltage level to said input high voltage level;
 a second level shifter configured to generate a second intermediate signal having a primary transition in response to said rising edge transition of said input signal and a secondary transition in response to said falling edge transition of said input signal, wherein said first level shifter is configured to generate said primary transition of said first intermediate signal in response to said falling edge transition faster than said second level shifter generates said secondary transition of said second intermediate signal in response to said falling edge transition and said second level shifter is configured to generate said primary transition of said second intermediate signal in response to said rising edge transition faster than said first level shifter generates said secondary transition of said first intermediate signal in response to said rising edge transition; and
 said level shifting circuitry comprises output switching circuitry configured to switch said output signal between said output high voltage level and said output low voltage level in response to said primary transition of said first intermediate signal and said primary transition of said second intermediate signal, wherein said output switching circuitry comprises:
  a pullup transistor configured to pull said output signal to said output high voltage level in response to said primary transition of one of said first intermediate signal and said second intermediate signal;
  a pulldown transistor configured to pull said output signal to said output low voltage level in response to said primary transition of the other of said first intermediate signal and said second intermediate signal;
  an additional pullup transistor configured to selectively assist said pullup transistor in pulling said output signal to said output high voltage level; and
  an additional pulldown transistor configured to selectively assist said pulldown transistor in pulling said output signal to said output low voltage level
 additional pullup control circuitry configured to couple a gate of said additional pullup transistor to said one of said first intermediate signal and said second intermediate signal in advance of said primary transition of said one of said first intermediate signal and said second intermediate signal, and to decouple said gate of said additional pullup transistor from said one of said first intermediate signal and said second intermediate signal in advance of said secondary transition of said one of said first intermediate signal and said second intermediate signal;

additional pulldown control circuitry configured to couple a gate of said additional pulldown transistor to said other of said first intermediate signal and said second intermediate signal in advance of said primary transition of said other of said first intermediate signal and said second intermediate signal, and to decouple said gate of said additional pulldown transistor from said other of said first intermediate signal and said second intermediate signal in advance of said secondary transition of said other of said first intermediate signal and said second intermediate signal; and a delay circuit configured to delay said output signal, wherein said additional pullup control circuitry controlling whether said gate of said additional pullup transistor is coupled to said one of said first intermediate signal and said second intermediate signal in dependence on the delayed output signal, and said additional pulldown control circuitry controlling whether said gate of said additional pulldown transistor is coupled to said other of said first intermediate signal and said second intermediate signal in dependence on said delayed output signal.

9. The level shifting circuitry according to claim 8, wherein said additional pullup control circuitry comprises a first pass gate configured to selectively couple said gate of said additional pullup transistor to said one of said first intermediate signal and said second intermediate signal in response to said delayed output signal; and said additional pulldown control circuitry comprises a second pass gate configured to selectively couple said gate of said additional pulldown transistor to said other of said first intermediate signal and said second intermediate signal in response to said delayed output signal.

10. The level shifting circuitry according to claim 8, wherein said additional pullup control circuitry comprises a first cutoff transistor configured to switch off said additional pullup transistor in response to said delayed output signal; and said additional pulldown control circuitry comprises a second cutoff transistor configured to switch off said additional pulldown transistor in response to said delayed output signal.

11. The level shifting circuitry according to claim 6, wherein said additional pullup transistor has a greater drive strength than said pullup transistor and said additional pulldown transistor has a greater drive strength than said pulldown transistor.

12. Level shifting circuitry for generating an output signal in response to an input signal, said input signal having one of an input high voltage level and an input low voltage level, said output signal having one of an output high voltage level and an output low voltage level, said level shifting circuitry comprising:

first level shifting means for generating a first intermediate signal having a primary transition in response to a falling edge transition of said input signal and a secondary transition in response to a rising edge transition of said input signal, said falling edge transition comprising a transition from said input high voltage level to said input low voltage level and said rising edge transition comprising a transition from said input low voltage level to said input high voltage level; and second level shifting means for generating a second intermediate signal having a primary transition in response to said rising edge transition of said input signal and a secondary transition in response to said falling edge transition of said input signal; wherein:

said first level shifting means is configured to generate said primary transition of said first intermediate signal in response to said falling edge transition faster than said second level shifting means generates said secondary transition of said second intermediate signal in response to said falling edge transition;

said second level shifting means is configured to generate said primary transition of said second intermediate signal in response to said rising edge transition faster than said first level shifting means generates said secondary transition of said first intermediate signal in response to said rising edge transition; and said level shifting circuitry comprises output switching means for switching said output signal between said output high voltage level and said output low voltage level in response to said primary transition of said first intermediate signal and said primary transition of said second intermediate signal, wherein said first level shifting means comprises a first feedback loop means for retaining signal values in one of a first state and a second state in dependence on said input signal, said first intermediate signal being obtained from the signal value at a first intermediate output point of said first feedback loop means, and said second level shifting means comprises a second feedback loop means configured to retain signal values in one of said first state and said second state in dependence on said input signal, said second intermediate signal being obtained from the signal value at a second intermediate output point of said second feedback loop means.

13. A method of generating an output signal in response to an input signal, said input signal having one of an input high voltage level and an input low voltage level, said output signal having one of an output high voltage level and an output low voltage level, said method comprising:

in response to a falling edge transition of said input signal from said input high voltage level to said input low voltage level, generating a primary transition of a first intermediate signal using a first level shifter and generating a secondary transition of a second intermediate signal using a second level shifter, said first level shifter generating said primary transition of said first intermediate signal in response to said falling edge transition faster than said second level shifter generates said secondary transition of said second intermediate signal in response to said falling edge transition;

in response to a rising edge transition of said input signal from said input low voltage level to said input high voltage level, generating a primary transition of said second intermediate signal using said second level shifter and generating a secondary transition of said first intermediate signal using said first level shifter, said second level shifter generating said primary transition of said second intermediate signal in response to said rising edge transition faster than said first level shifter generates said secondary transition of said first intermediate signal in response to said rising edge transition; and switching said output signal between said output high voltage level and said output low voltage level in response to said primary transition of said first intermediate signal and said primary transition of said second intermediate signal, wherein said first level shifter retains signal values in a first feedback loop in one of a first state and a second state in dependence on said input signal, said first intermediate signal is obtained from the signal value at a first intermediate output point of said first feedback loop, and said second level shifter retains signal values in a second feedback loop in one of said first state and said second state in dependence on said input signal, said second intermediate signal is obtained from the signal value at a second intermediate output point of said second feedback loop.

* * * * *